United States Patent
Pilchowski

(10) Patent No.: US 7,410,901 B2
(45) Date of Patent: Aug. 12, 2008

(54) SUBMICRON DEVICE FABRICATION

(75) Inventor: Jorg Pilchowski, Mercer Island, WA (US)

(73) Assignee: Honeywell International, Inc., Morristown, NJ (US)

( * ) Notice: Subject to any disclaimer, the term of this patent is extended or adjusted under 35 U.S.C. 154(b) by 176 days.

(21) Appl. No.: 11/380,593

(22) Filed: Apr. 27, 2006

(65) Prior Publication Data

US 2007/0254487 A1 Nov. 1, 2007

(51) Int. Cl.
*H01L 21/461* (2006.01)
*B81B 7/02* (2006.01)

(52) U.S. Cl. .......... 438/689; 438/694; 438/695; 438/702; 438/703; 438/712; 438/717; 438/723; 438/734; 438/751; 438/756; 438/759; 216/2; 977/887; 977/888; 977/890; 977/891; 977/892; 257/E21.24; 257/E21.483

(58) Field of Classification Search .......... 438/689, 438/759, 694, 695, 702, 703, 712, 717, 723, 438/734, 751, 756; 216/2; 977/887, 888, 977/890, 891, 892; 257/E21.24, E21.483
See application file for complete search history.

(56) References Cited

U.S. PATENT DOCUMENTS

| | | | | |
|---|---|---|---|---|
| 3,342,650 A * | 9/1967 | Tauchi et al. | ........... | 438/546 |
| 3,811,975 A * | 5/1974 | Van Lierop et al. | ........... | 438/476 |
| 4,356,730 A * | 11/1982 | Cade | ........... | 73/514.26 |
| 5,235,187 A * | 8/1993 | Arney et al. | ........... | 250/306 |
| 5,426,070 A * | 6/1995 | Shaw et al. | ........... | 216/2 |
| 2006/0228064 A1* | 10/2006 | Hunt et al. | ........... | 385/2 |
| 2006/0249776 A1* | 11/2006 | Manning et al. | ........... | 257/307 |
| 2007/0052322 A1* | 3/2007 | Tai et al. | ........... | 310/307 |

* cited by examiner

*Primary Examiner*—Thanh Van Pham
(74) *Attorney, Agent, or Firm*—Black Lowe & Graham PLLC

(57) ABSTRACT

A method for fabricating substrate material to include trenches and unreleased beams with submicron dimensions includes etching a first oxide layer on the substrate to define a first set of voids in the first oxide layer to expose the substrate. A second oxide layer is accreted to the first oxide layer to narrow the first set of voids to become a second set of voids on the substrate. A polysilicon layer is deposited over the second oxide layer, the first oxide layer and the substrate. A third set of voids is etched into the polysilicon layer. Further etching widens the third set of voids to define a fourth set of voids to expose the first oxide layer and the substrate. The first oxide layer and the substrate is deeply etched to define beams and trenches in the substrate.

5 Claims, 5 Drawing Sheets

SUBMICRON DEVICE FABRICATION

GOVERNMENT RIGHTS

The U.S. Government has a paid-up license in this invention and the right in limited circumtances to require the patent owner to license others on reasonable terms as provided for by the terms of contract No. 2001004469C.

BACKGROUND OF THE INVENTION

Micro-Electro-Mechanical Systems (MEMS) along with a subset, the Nano-Electro-Mechanical Systems (NEMS) sensors including gyroscopes and accelerometers require very specific geometric relationships between distinct moving and stationary elements in order to function most reliably. To date, the reliability of photolithography has made photolithography the means of choice for repeatably producing the geometric relationships necessary to produce MEMS sensors.

Photolithography is the process of transferring geometric shapes on a mask to the surface of a silicon wafer. The steps involved in the photolithographic process are wafer cleaning; barrier layer formation; photoresist application; soft baking; mask alignment; exposure and development; and hard-baking.

In a first step, the wafers are chemically cleaned to remove particulate matter on the surface as well as any traces of organic, ionic, and metallic impurities. After cleaning, silicon dioxide, which serves as a barrier layer, is deposited on the surface of the wafer. After the formation of the $SiO2$ layer, photoresist is applied to the surface of the wafer.

Photoresist processes become geometrically more expensive as the scale of traces approach the sub-micron scale. The expense is tied to necessity of use of reduction steppers or nanoimprinters configured to work in the more demanding environment of submicron dimensions. Not only is it necessary to reproduce submicron geometries but alignment of patterns of such detail is very demanding technologically. With the greater expense, the use of reduction steppers or nanoimprinters also allows for far greater component density on the silicon die. In MEMS sensor fabrication, however, large surfaces do not require dense packing of distinct components such as transistors. MEMS trenches and beams tend to have one or two critical dimension of such components as charged plates acting as "half capacitors." MEMS components need not be densely pack but merely require very tight tolerances and clearances for optimal performance as fabricated.

What is needed in the art is a fabrication method for MEMS components that can produce submicron trenches and beams without significantly increasing the expense of fabrication.

SUMMARY OF THE INVENTION

A method for fabricating substrate material to include trenches and unreleased beams with submicron dimensions includes etching a first oxide layer on the substrate to define a first set of voids in the first oxide layer to expose the substrate. A second oxide layer is accreted to the first oxide layer to narrow the first set of voids to become a second set of voids on the substrate. A polysilicon layer is deposited over the second oxide layer, the first oxide layer and the substrate. A third set of voids is etched into the polysilicon layer. Further etching widens the third set of voids to define a fourth set of voids to expose the first oxide layer and the substrate. The first oxide layer and the substrate is deeply etched to define beams and trenches in the substrate.

The embodiment comprises a system for etching a first oxide layer on the substrate to define a first set of voids in the first oxide layer exposing the substrate including thermally oxidizing a first oxide layer on the substrate. A first mask is applied in a first mask pattern to the first oxide layer selectively exposing the first oxide layer. The first mask pattern is etched into the first oxide layer to expose the substrate. The first mask is etched to expose the first oxide layer.

In a nonlimiting example, accreting a second oxide layer narrows the first set of voids to become a second set of voids on the substrate includes thermally oxidizing a second oxide layer on the first oxide layer and on the exposed substrate. Etching the second oxide layer exposes the first oxide layer and the substrate.

Etching a third set of voids into the polysilicon layer includes, in one embodiment, applying a second mask onto the polysilicon layer to form a second mask pattern selectively exposes the polysilicon layer. Thermal oxidization of the polysilicon layer grows a polysilicon oxide layer. The exposed oxidized polysilicon layer is etched to expose the substrate. The second mask pattern is removed to clean the surface of the substrate and of the remaining polysilicon.

In accordance with further aspects of the invention, etching the polysilicon layer and the substrate layer exposes the first oxide layer and the substrate includes depositing a metal layer uniformly across the polysilicon layer and substrate. A third mask is applied in a third masking pattern to selectively expose the metal layer. The exposed metal layer is then etched to expose the oxide layer and the substrate. Etching the oxide layer and the substrate layer includes etching the substrate to define beams and trenches in the substrate. The third masking layer is removed to clean the substrate surface.

As will be readily appreciated from the foregoing summary, the invention provides a method of fabricating devices with sub-micron dimensions by alternately applying isotropic oxidation in and anisotropic etching to selectively grow or shrink intended beams or trenches.

BRIEF DESCRIPTION OF THE DRAWINGS

The preferred and alternative embodiments of the present invention are described in detail below with reference to the following drawings.

DETAILED DESCRIPTION OF THE PREFERRED EMBODIMENT

Figure 1:
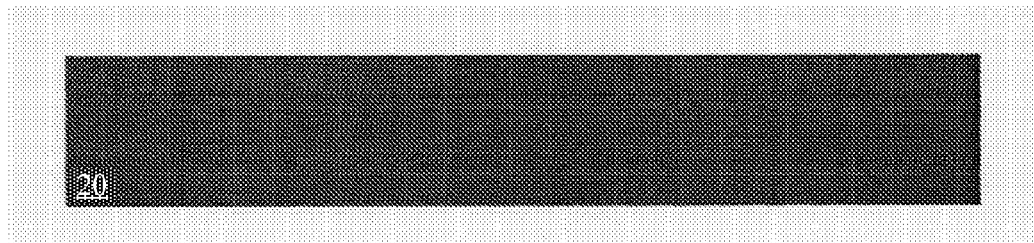
FIG. 1 is a cross-section view of a substrate.

By way of overview, a method for fabricating substrate material to include trenches and unreleased beams with submicron dimensions includes etching a first oxide layer on the substrate to define a first set of voids in the first oxide layer to expose the substrate. A second oxide layer is accreted to the first oxide layer to narrow the first set of voids to become a second set of voids on the substrate. A polysilicon layer is deposited over the second oxide layer, the first oxide layer and the substrate. A third set of voids is etched into the polysilicon layer. Further etching widens the third set of voids to define a fourth set of voids to expose the first oxide layer and the substrate. The first oxide layer and the substrate are deeply etched to define beams and trenches in the substrate.

A method of fabricating devices with sub-micron dimensions includes applying a two-step isotropic oxidation in conjunction with anisotropic oxide etching by such means as, for example, reactive ion etching (RIE). Isotropic refers to the property of being independent of direction while anisotropic refers to the property of being highly directionally dependent. By selective application of each of the processes the method can be used to either undercut or to grow trench walls to vary dimensions of trenches and beams from those of the applied mask. Due to the highly predictable rates of both oxide deposition and anisotropic etching the process produces very consistent dimensions with some acceptable (½ to ¼ micron rounding at corners). The method produces very well dimensioned MEMS sensors at a much lower cost to the fabricator that if the standard submicron photolithography practices had been employed.

The anisotropic nature of reactive ion etching is an attribute of the process itself. During reactive ion etching, gaseous species from a plasma react with surface atoms of a substrate to form compounds or molecules. Voids are defined as the formed species are urged to leave the surface either by thermal displacement, if the vapor pressure is high enough, or because of ion bombardment. By suitable selection of gas species according to the substrate composition, the reaction is rate-limited. Rate limiting occurs according to the production rate of reactive species in the plasma, by the surface reaction rate, or by the emission rate of selected products.

In many cases, RIE using ion bombardment enhances the directionality, or anisotropy, of the etching process. The ion bombardment is advantageously used to clean surfaces, allowing the reaction to occur selectively at bombardment sites, either assisting or stimulating the reaction itself at the bombardment sites; In other applications, ion bombardment may help to desorb or detrap the product molecule liberating the product molecule from the surface of the substrate. In many of these reactive ion-etching chemistries, a product is formed that is not volatile and the liberation physically removes the molecules from the etch site. Where no bombardment occurs the product molecules protect vertical walls of trenches from isotropic chemical etching, while the same protecting film is removed from the bottom surface of the trench by the energetic ions. Because of the very predictable rates at which RIE creates voids, trenches are uniformly and predictably deep with well-defined vertical walls.

On the other hand, isotropic oxide deposition evenly grows oxide in all directions, along x-, y-, and z-axes, from the unmasked substrate and therefore can grow to overhang a trench. A variety of methods of isotropic oxide deposition exists but the presently preferred embodiment of oxide deposition is by plasma enhanced chemical vapor deposition (PECVD). PECVD is an important deposition method for the fabrication of VLSI and TFT dies. PECVD has two advantages compared with the conventional chemical vapor deposition (CVD) method in that it exploits low process temperature and yields oxide deposits with flexible film properties. A low thermal budget requirement for most production results in lower production costs. Selecting PECVD as a preferred method is not to the exclusion of other isotropic oxide deposition processes that will also suitably deposit oxide thereby enabling horizontal growth of vertical walls. A non-limiting example of the alternate use of isotropic growth of oxides in conjunction with anisotropic etching demonstrates the utility of the method to produce submicron dimensioned trenches and beams.

Referring to FIG. 1, a substrate 20 is provided for fabrication of a device with sub-micron dimensions. By way of non-limiting example, Silicon on Insulator wafers are a suitable substrate for such fabrication. SOI is a specific bonded wafer semiconductor technology that produces higher-performing, lower power devices than traditional bulk silicon techniques. SOI works by placing a thin, insulating layer (usually silicon oxide or glass) between a thin layer of silicon and the silicon substrate to reduce the amount of electrical charge that the transistor has to move during a switching operation, thus making the transistor faster and allowing the transistor to switch using less energy. SOI chips can be as much as 15 percent faster and use 20 percent less power than pure silicon substrate chips.

Figure 2:
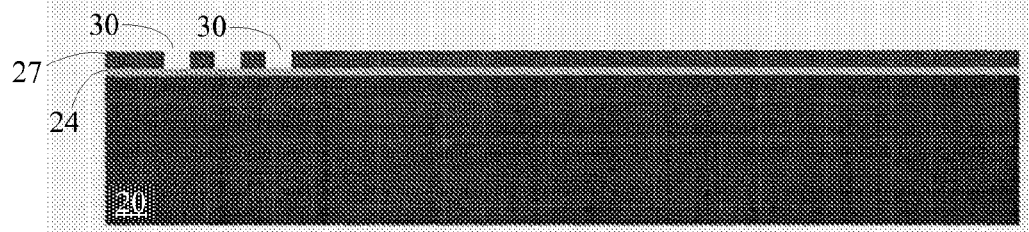
FIG. 2 is a cross-section view of the substrate having a first uniform oxide layer.

Referring to FIG. 2, a first oxide layer 24 is grown on the substrate 20 by isotropic thermal oxidation. The first oxide layer 24 is uniform across a surface of the substrate 20. In one embodiment, first oxide layers 24 of 5,000 Angstroms are sufficient to enable the method. Photolithography selectively deposits a masking pattern of a first application of photoresist 27 while defining apertures 30 in the first application of photoresist 27 exposing the first oxide layer 24. The pattern of the first application of photoresist 27 is configured to create initial dimensions of desired devices. One exemplary embodiment, a pattern of the first application of photoresist 27 having apertures 30 with dimensions of typically as small as 1.2 µm.

Figure 3:
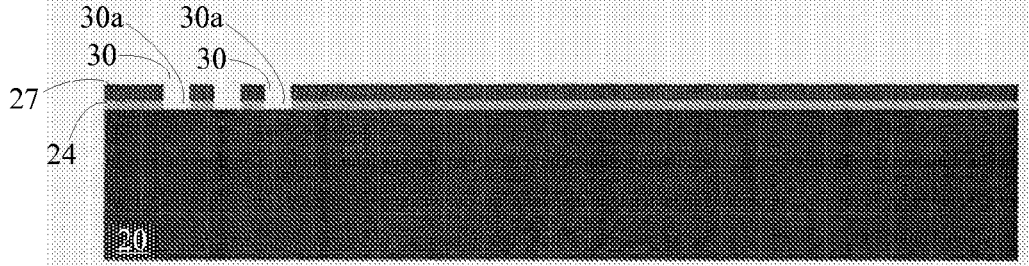
FIG. 3 is a cross-section view of the substrate having the first oxide layer and a mask.

Referring to FIG. 3, an application of RIE predictably removes material from the oxide layer 24 to create a first set of voids 30a extending from the apertures 30 as a result of RIE removing oxide from the oxide layer according to the first application of photoresist 27. The RIE is prolonged suitably to remove substantially all of the first oxide layer 24 in the first set of voids 30a while not breaching into the substrate 20.

Figure 4:
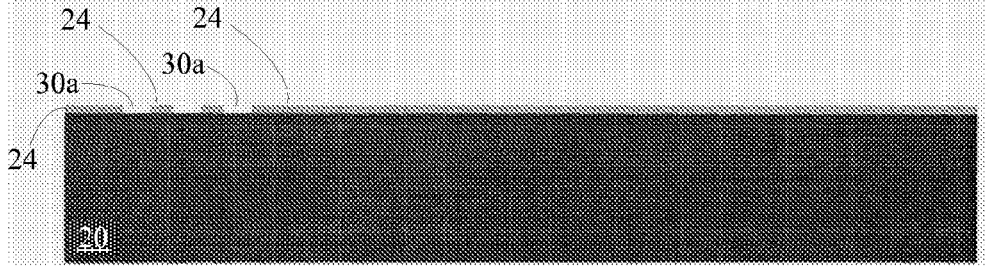
FIG. 4 is a cross-section view of the substrate having an etched first oxide layer.

Referring to FIG. 4, the first application of photoresist 27 has been removed re-exposing the first oxide layer 24. Stripping the first application of photoresist is by means selected based upon the particular composition of the photoresist. Sufficient additional cleaning of the surface assures that the oxide layer is free of any contaminants that might block either of oxide deposition or etching.

Figure 5:
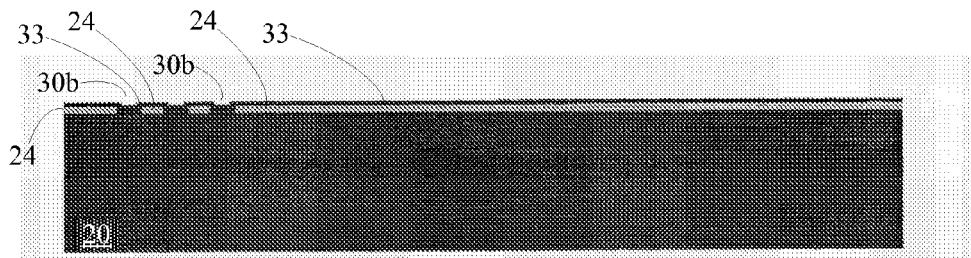
FIG. 5 is a cross-section view of the substrate having first and second oxide layers.

Referring to FIG. 5, the first oxide layer 24 is augmented by growing a second oxide layer 33 across the now non-uniform surface of both the first oxide layer 24 and the substrate 20 exposed at the first set of voids 30a (FIG. 4) shrinking the first set of voids to voids of diminished width 30b having a much smaller dimension across each of the voids of diminished width 30b. In an exemplary but non-limiting embodiment, the second oxide layer 33 of 5.237 Angstroms creates an oxide step at a boundary of one of the voids of diminished width 30b of 2.263 Angstroms.

Figure 6:
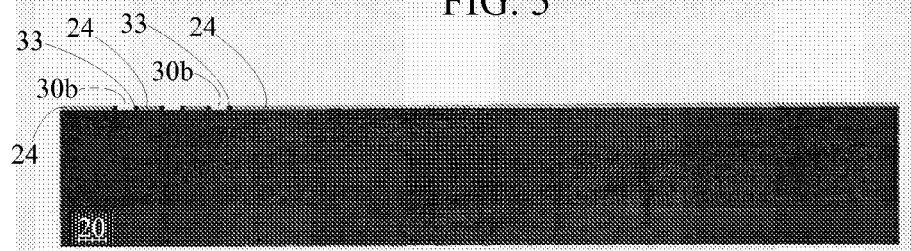
FIG. 6 is a cross-section view of the substrate having first and second oxide layers and etched voids.

Referring to FIG. 6, anisotropic RIE is used to plane away that portion of the second oxide layer 33 that overlays the remaining portions first oxide layer 24 without removing substantially any of the remaining first oxide layer 24. The same anisotropic RIE also deepens the voids of diminished width 30b by removing the second layer of oxide 33 in the voids of diminished width 30b, while leaving the second layer of oxide 33 at vertical walls of the voids of diminished width 30b. The RIE is timed to only remove the second oxide layer 33 as indicated and to breach either of the first oxide layer 24 or the substrate 20 located at bottoms of the voids of diminished width.

Figure 7:
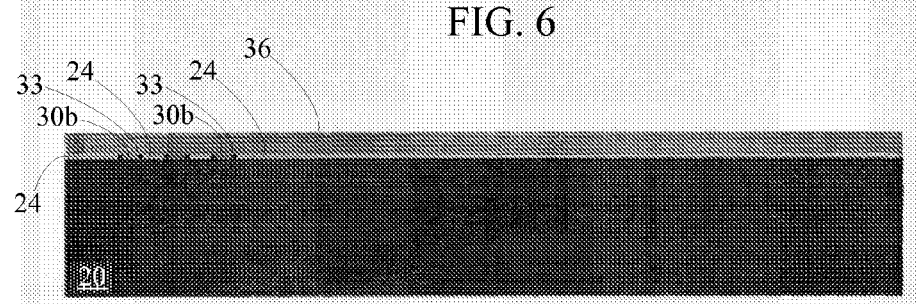
FIG. 7 is a cross-section view of the substrate having first and second oxide layers, as well as a polysilicon layer.

Referring to FIG. 7, third deposition of material, this time a first polysilicon layer 36, builds up the entire surface to a uniformly and generally smooth level filling in the voids of diminished width 30b in the first oxide layer 24. Thin film depositions such as the first polysilicon layer 36 (also known as polycrystalline silicon), are widely used in MOS transistor gate electrode fabrication because polysilicon is compatible with high temperature processing and interfaces very well with thermal Silicon oxide. Those same qualities add to polysilicon's utility in the method.

Polysilicon in the first polysilicon layer 36 can be deposited conformally over steep topography. The first polysilicon layer 36 is deposited by suitable means such as by thermal decomposition or pyrolysis of silane at temperatures from 580-650 degrees C, with the deposition rate exponentially increasing with temperature. The deposition rate is also affected by the pressure of silane, which translates to silane concentration. Other important variables in polysilicon deposition are pressure and dopant concentration. The deposition is very predictable, repeatable, and isotropic.

Figure 8:
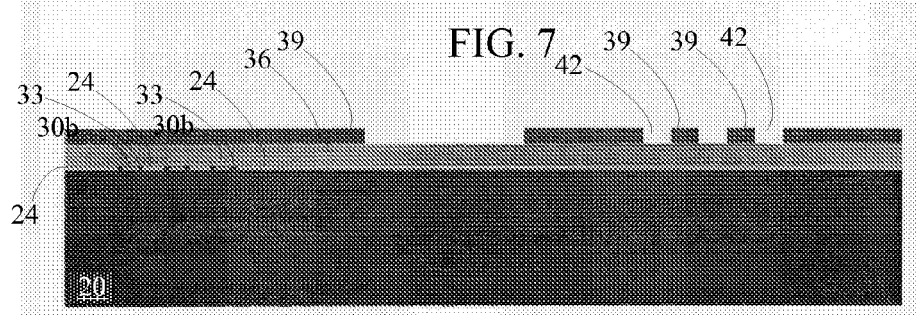
FIG. 8 is a cross-section view of the substrate having first and second oxide layers, the polysilicon layer and a masking layer.

Referring to FIG. 8, a second application of photoresist 39 is applied to the first polysilicon layer 36 using photolithography. The polysilicon layer 36, serves as a fused interface on the first oxide layer 24 adhering as well to the substrate 20 exposed by the voids of diminished width 30b in the first oxide layer 24, those voids having the second oxide layer 33 deposited on the vertical walls. An advantage of the inventive method is that with the exception of the second application of photoresist 39, all of the depositions and etchings have been self-registering requiring no centering or alignment of trenches and beams as the layers are alternately deposited and etched away. Because the second application of photoresist 39 is directed at distinct structures from those defined by the first application of photoresist 27 (FIG. 2), centering or registration is more readily achieved than in other means of iterative chip fabrication. The photolithography of the second application of photoresist 39 defines a second set of apertures 42.

Figure 9:
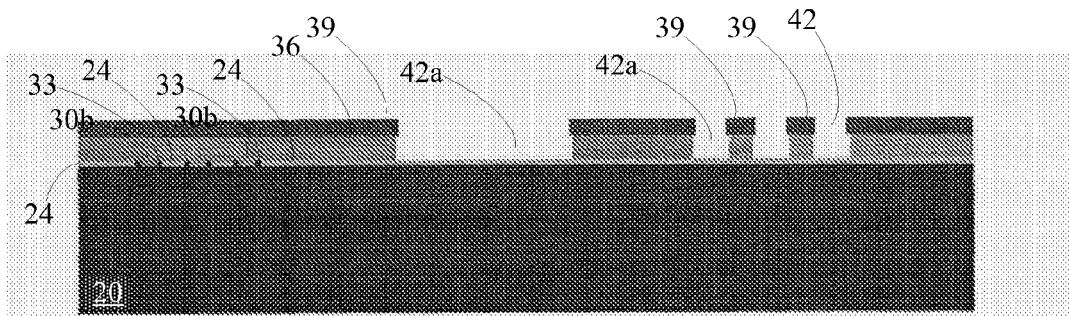
FIG. 9 is a cross-section view of the substrate having first and second oxide layers, the polysilicon layer, and the masking layer.

Referring to FIG. 9, anisotropic RIE is employed to create a second set of voids 42a at the sites of the second set of apertures 42. Again, the RIE is timed such that the second set of voids extend through the polysilicon layer 36 to expose the first oxide layer 24 fused to the substrate 20 without breaching the first oxide layer 24. The polysilicon layer 36 is a foundation for additional deposition and presents structural integrity with the substrate 20 and the first oxide layer 24 and second oxide layer 33.

Figure 10:
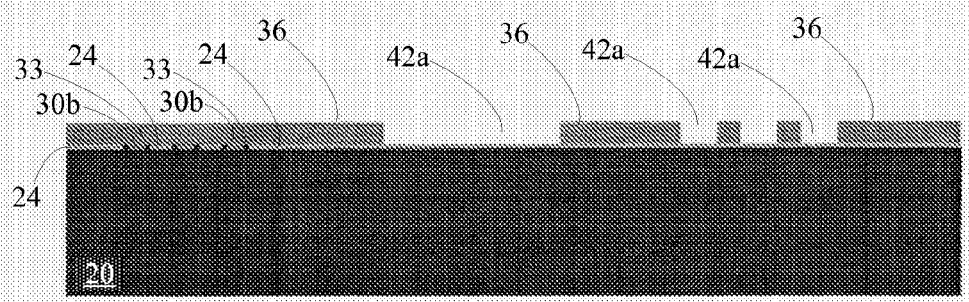
FIG. 10 is a cross-section view of the substrate having first and second oxide layers, the polysilicon layer, and the masking layer.

Referring to FIG. 10, the photoresist 39 (FIG. 9) is removed by stripping and washing, as above with reference to the first application of photoresist 27 (with reference to FIG. 4), to cleanly expose the polysilicon layer 36 and the first oxide layer 24 in the second set of voids 42a.

Figure 11:
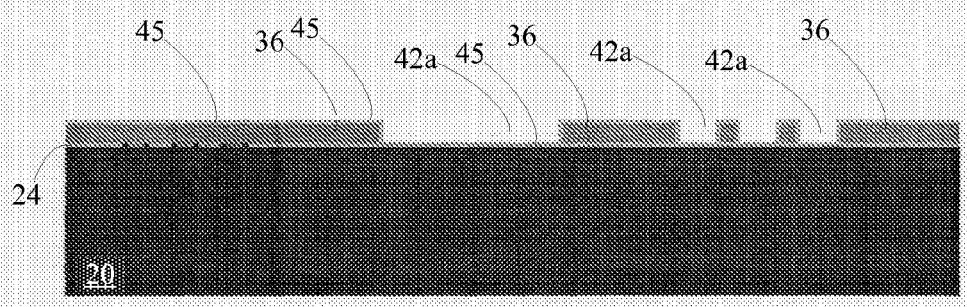
FIG. 11 is a cross-section view of the substrate having first and second oxide layers, and the masking layer.

Referring to FIG. 11, a third layer of oxide 45 is grown isotropically over the whole of the polysilicon layer 36 and the first oxide layer 24 in the second set of voids 42a as well as on vertical walls of the second set of voids 42a. Importantly, the third layer of oxide 45 is not produced by oxide deposition but by sacrificial thermal oxidation of the polysilicon isotropically.

Thermal oxidation, as its name implies, is a technique that uses extremely high temperatures (usually between 700-1300 degrees C.) to promote the growth rate of oxide layers. The thermal oxidation of silicon or of silcon dioxide includes exposing the silicon substrate to an oxidizing environment of oxygen or steam at elevated temperature, producing oxide films whose thicknesses range from 60 to 10,000 Angstroms. Oxidation of silicon is not difficult, since silicon has a natural inclination to form a stable oxide even at room temperature, as long as an oxidizing ambient is present. The elevated temperature used in thermal oxidation therefore serves primarily as an accelerator of the oxidation process, resulting in thicker oxide layers per unit of time.

Thermal oxidation generally occurs in an oxidation furnace (or diffusion furnace, since oxidation is basically a diffusion process involving oxidant species) to provide heat necessary to reach an oxidizing ambient temperature. A furnace typically consists of: 1) a cabinet; 2) a heating system; 3) a temperature measurement and control system; 4) fused quartz process tubes where the wafers undergo oxidation; 5) a system for moving process gases into and out of the process tubes; and 6) a loading station used for loading (or unloading) wafers into (or from) the process tubes.

Figure 12:
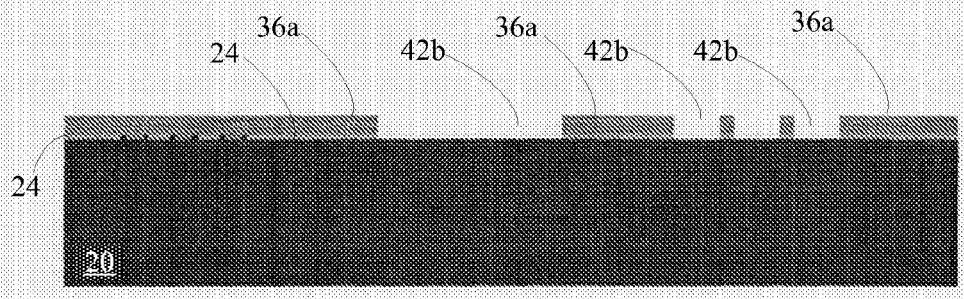
FIG. 12 is a cross-section view of the substrate having first and second oxide layers, and the masking layer.

Thermal oxidation isotropically oxidizes a predictable layer of silicon and silcon dioxide. Referring to FIG. 12, RIE removes the thermally formed oxide layer 45 (FIG. 11) enhancing the width of the second set of voids 42a (FIG. 11) to a second set of wider voids 42b. As the second set of voids 42a (FIG. 11) expand to a second set of wider voids 42b, they do so by claiming real estate from the polysilicon layer 36 (FIG. 11) to form narrower beams 36a. Narrowing the beams to form the narrower beams 36a allows the shrinking of the width of the narrower beams 36a to submicron dimensions just as the voids of diminished width 30b (FIG. 6) may shrink to submicron dimensions without the use of more expensive photolithography techniques.

Figures 13, 14, 15, 16:
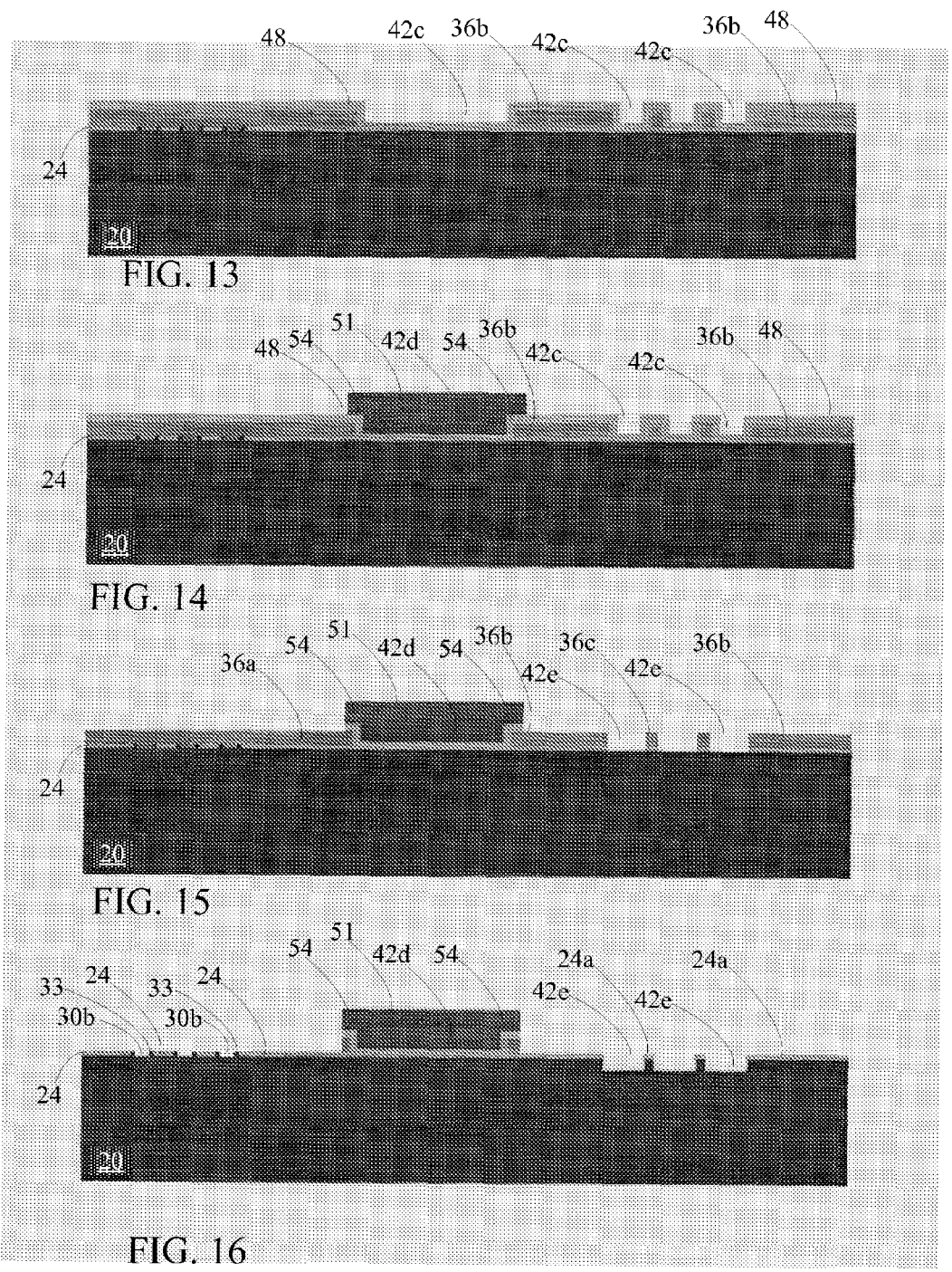
FIG. 13 is a cross-section view of the substrate having first and second oxide layers, and a metal layer.
FIG. 14 is a cross-section view of the substrate having first and second oxide layers, the metal layer and a mask.
FIG. 15 is a cross-section view of the substrate first and second oxide layers, and metal contacts.
FIG. 16 is a cross-section view of the substrate having first and second oxide layers.

Referring to FIG. 13, a uniform metal deposition forms a blanket ohmic contact. After RIE removes the formed oxide layer 45 (FIG. 11), a metal blanket contact 48 is deposited by sputtering, evaporation or chemical vapor deposition (CVD). Sputtering is a faster and more convenient method of metal deposition than evaporation but the ion bombardment from the plasma may induce surface states or even invert the charge carrier type at the surface. For this reason the gentler but still rapid CVD is increasingly preferred. The second set of wider voids 42b (FIG. 12) are narrowed to a second set of wider voids 42c by the deposition of the blanket metal contact 48.

Similarly, the beams are also widened by the deposition of the blanket metal contact 48 to yield wider clad beams 36b.

Referring to FIG. 14, a third application of photoresist 51 is placed in one of the wider voids 42d to cover the polysilicon layer between (by way of non-limiting example) two of the clad beams 36b thereby covering a portion of the clad beams 36b to pattern metal contacts from the metal blanket contact 48 at each of two oxide steps 54 ultimately to form patterned metal contacts.

Referring to FIG. 15, all of the unprotected portions of the metal blanket contact 48 are removed by isotropic etching using, by way of non-limiting example, RIE. RIE is commonly used to etch metal layers. Other isotropic means of etching will also suitably accomplish the intended result of removing the metal blanket contact 48 where exposed.

Removing the metal blanket contact 48 widens the second set of voids to form unclad voids 42e. The unclad voids 42e are wider than the voids 42c (FIG. 13) thereby again narrowing the polysilicon layer to form a narrowed beam of polysilicon 36c.

Referring to FIG. 16, the whole of the polysilicon layer 36a, 36b, and 36c (FIG. 15) is etched away anisotropically by RIE exposing the original SOI substrate 20. One embodiment uses a type of RIE, deep reactive-ion etching (DRIE) of silicon, to remove the polysilicon layer 36a, 36b, and 36c. Additionally, DRIE deepens the voids 42e by the removal of SOI substate 20. Removal of the polysilicon layer 36c (FIG. 15) exposes the first oxide layer 24a overlaying the substrate 20. The island of oxide 24 will define a submicron width beam in the underlying substrate 20.

Continued DRIE further defines vertical voids 30b and 42e to depths that are typically in the 10- to 750-μm range. These deepened voids 30b and 42e either have the submicron width in the case of the first set of voids 30b or are separated by beams 57 having a submicron width. In the case of the voids, the growing of the first oxide layer 24 with the addition of the second oxide layer 33 created the voids of diminished width 30b. In the case of beams, the isotropic thermal oxidation oxidized a predictable layer of silicon and silicon dioxide to remove width from the beams 58 to diminish the width. The alternate application of isotropic and anisotropic processes enables designs of MEMS sensors with submicron dimensions.

Figure 17:
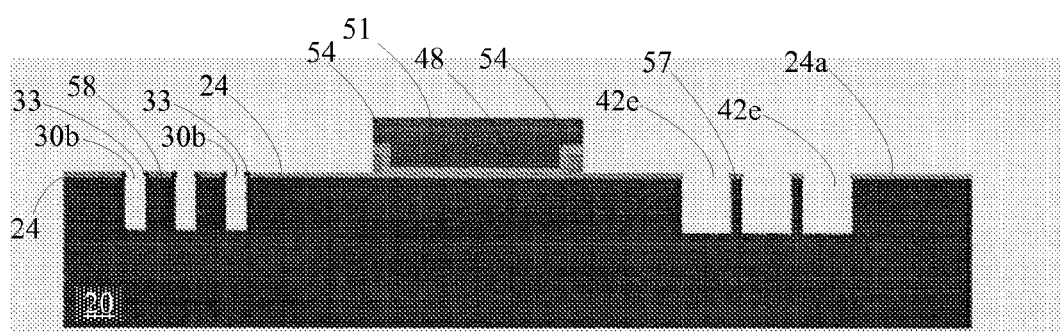
FIG. 17 is a cross-section view of the substrate having the first oxide layer.
Figure 18:
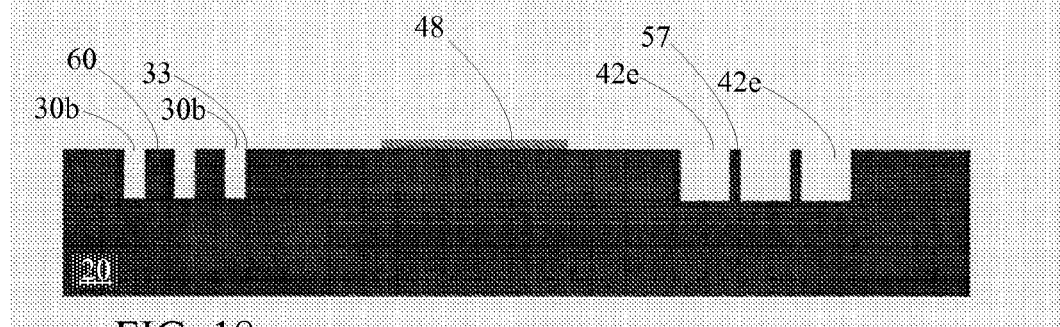
FIG. 18 is a cross-section view of the substrate.

To remove all of the masking oxides such as the first oxide layer 24 (FIG. 17) and the second oxide layer 33 (FIG. 17), RIE is applied anisotropically. Referring to FIG. 18, not only are the oxide layers removed but after RIE, the third application of photoresist 51 is stripped as well to leave the metal contacts 48. The substrate 20 with its metal contacts 48 stands ready for device release and drying to avoid stiction. The device release is by known means.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely reference to the claims that follow.

The embodiments of the invention in which an exclusive property or privilege is claimed are defined as follows:

1. A method for fabricating substrate material to include trenches and unreleased beams with submicron dimensions comprising:
   etching a first oxide layer on the substrate to define a first set of voids in the first oxide layer exposing the substrate;
   accreting a second oxide layer to narrow the first set of voids;
   depositing a polysilicon layer over the second oxide layer, the first oxide layer and the substrate;
   etching a second set of voids into the polysilicon layer at distinct structures from the first set of voids;
   etching the polysilicon layer to widen the second set of voids to define a third set of voids exposing the first oxide layer and the substrate; and
   etching the first oxide layer and the substrate to define beams and trenches in the substrate.

2. The method of claim 1, wherein etching the first oxide layer on the substrate to define the first set of voids in the first oxide layer exposing the substrate includes:
   thermally oxidizing the first oxide layer on the substrate;
   applying a first mask in a first mask pattern to the first oxide layer selectively exposing the first oxide layer;
   etching the first mask pattern into the first oxide layer to expose the substrate; and
   removing the first mask to expose the first oxide layer.

3. The method of claim 1, wherein accreting the second oxide layer to narrow the first set of voids to become the second set of voids on the substrate includes:
   thermally oxidizing a second oxide layer on the first oxide layer and on the exposed substrate; and
   etching the second oxide layer to expose the first oxide layer and the substrate.

4. The method of claim 1, wherein etching the third set of voids into the polysilicon layer includes:
   applying a second mask onto the polysilicon layer to form a second mask pattern selectively exposing the polysilicon layer;
   thermally oxidizing the polysilicon layer;
   etching the exposed oxidized polysilicon layer to expose the substrate; and
   removing the second mask pattern.

5. The method of claim 1, wherein:
   etching the polysilicon layer and the substrate layer to expose the first oxide layer and the substrate further includes:
      depositing a metal layer uniformly across the polysilicon layer and substrate;
      applying a third mask in a third masking pattern to selectively expose the metal layer;
      etching the exposed metal layer exposing the oxide layer and the substrate; and
      etching the oxide layer and the substrate layer; and
   etching the substrate to define beams and trenches in the substrate includes:
      removing the third masking layer.

* * * * *